(12) United States Patent
Hsiao

(10) Patent No.: US 8,078,050 B2
(45) Date of Patent: Dec. 13, 2011

(54) CAMERA MODULE AND ASSEMBLING METHOD THEREOF

(75) Inventor: Yu-Jung Hsiao, Taipei (TW)

(73) Assignee: Primax Electronics Ltd., Taipei (TW)

( * ) Notice: Subject to any disclaimer, the term of this patent is extended or adjusted under 35 U.S.C. 154(b) by 125 days.

(21) Appl. No.: 12/559,106

(22) Filed: Sep. 14, 2009

(65) Prior Publication Data
US 2011/0002685 A1    Jan. 6, 2011

(30) Foreign Application Priority Data
Jul. 3, 2009    (TW) .............................. 98122513 A

(51) Int. Cl.
*G03B 17/02* (2006.01)
(52) U.S. Cl. ...................................................... 396/535
(58) Field of Classification Search .................. 396/439, 396/535, 542; 348/335, 340; 257/432; 359/824
See application file for complete search history.

(56) References Cited

U.S. PATENT DOCUMENTS

| | | | | |
|---|---|---|---|---|
| 4,215,387 A | * | 7/1980 | Negishi et al. | 396/542 |
| 2004/0150740 A1 | * | 8/2004 | Hsin | 348/340 |
| 2006/0152826 A1 | * | 7/2006 | Tsutsui | 359/824 |
| 2006/0290801 A1 | * | 12/2006 | Jao | 348/335 |
| 2008/0303107 A1 | * | 12/2008 | Minamio et al. | 257/432 |
| 2010/0084726 A1 | * | 4/2010 | Lee et al. | 257/432 |

\* cited by examiner

*Primary Examiner* — Clayton E Laballe
*Assistant Examiner* — Autumn Parker
(74) *Attorney, Agent, or Firm* — Kirton & McConkie; Evan R. Witt

(57) ABSTRACT

A camera module and an assembling method thereof are provided. The camera module includes a circuit board, a base plate, an image chip, a holder and a lens assembly. The circuit board includes a first surface, a second surface and a hollow portion running through the first surface and the second surface. The base plate is fixed on the second surface of the circuit board such that the hollow portion of the circuit board is sheltered by the base plate. The image chip is disposed on the base plate and accommodated within the hollow portion. The holder is fixed on the first surface of the circuit board. The lens assembly is fixed on the holder.

17 Claims, 2 Drawing Sheets

CAMERA MODULE AND ASSEMBLING METHOD THEREOF

FIELD OF THE INVENTION

The present invention relates to a camera module, and more particularly to a camera module for use in an electronic device.

BACKGROUND OF THE INVENTION

A camera module is a modular image capturing device that integrates a lens assembly, an image chip and a circuit board. The camera module is widely used in an electronic device with an image-capturing function. The electronic device with the image-capturing function includes for example a mobile phone, a notebook computer, a portable music player, or the like. Recently, the general trends in designing the electronic device are toward small size, light weightiness and easy portability. Since the demand on the size of the camera module becomes more stringent, the overall height of the camera module needs to be as low as possible.

FIG. 1 is a schematic side view illustrating a conventional camera module. As shown in FIG. 1, the camera module 1 comprises a circuit board 11, a base plate 12, an image chip 13, a holder 14 and a lens assembly 15. The base plate 12 is disposed on the circuit board 11 and has a recess 121 for accommodating the image chip 13. Through a wire layer (not shown) of the base plate 12, the sensing signal generated by the image chip 13 could be transmitted to the circuit board 11. The holder 14 is disposed on the base plate 12 for supporting and fixing the lens assembly 15. Via the lens assembly 15, an external image could be focused on the image chip 13.

Please refer to FIG. 1 again. Since the base plate 12 of the conventional camera module 1 should have the recess 121 for accommodating the image chip 13, a thickness from a bottom of the recess 121 to the circuit board 11 is necessary to support the image chip 13. Moreover, since the circuit board 11 and the holder 14 have their thickness themselves, it is difficult to lower the overall height of the camera module 1. Therefore, there is a need of providing a camera module having a reduced overall height while maintaining the functions of the components thereof.

SUMMARY OF THE INVENTION

It is an object of the present invention to provide a camera module and a method for assembling the camera module, thereby lowering the overall height of the camera module.

In accordance with an aspect of the present invention, there is provided a camera module. The camera module includes a circuit board, a base plate, an image chip, a holder and a lens assembly. The circuit board includes a first surface, a second surface and a hollow portion running through the first surface and the second surface. The base plate is fixed on the second surface of the circuit board such that the hollow portion of the circuit board is sheltered by the base plate. The image chip is disposed on the base plate and accommodated within the hollow portion. The holder is fixed on the first surface of the circuit board. The lens assembly is fixed on the holder.

In an embodiment, the image chip is electrically connected with the circuit board by a wire bonding process.

In an embodiment, the circuit board is a flexible printed circuit board.

In an embodiment, the circuit board is a rigid printed circuit board.

In an embodiment, the circuit board is a rigid-flexible printed circuit board.

In an embodiment, the base plate is a glass plate.

In an embodiment, the base plate is a ceramic plate.

In an embodiment, the base plate is an acrylics plate.

In an embodiment, the base plate is a metallic plate.

In an embodiment, the metallic plate is an iron plate.

In an embodiment, the metallic plate is an aluminum plate.

In an embodiment, the metallic plate is a copper plate.

In an embodiment, the metallic plate is a steel plate.

In an embodiment, the metallic plate is a stainless steel plate.

In accordance with another aspect of the present invention, there is provided a method for assembling a camera module. Firstly, an image chip is fixed on a base plate. Then, a circuit board is provided. The circuit board includes a first surface, a second surface and a hollow portion running through the first surface and the second surface. Then, a base plate is fixed on the second surface of the circuit board such that the image chip is accommodated within the hollow portion of the circuit board. Then, the image chip is electrically connected with the circuit board. Afterwards, a holder is fixed on the first surface of the circuit board such that a lens assembly is supported by the holder.

In an embodiment, the image chip is electrically connected with the circuit board by a wire bonding process.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention provides a camera module for use in an electronic device with an image-capturing function. The electronic device with the image-capturing function includes for example a mobile phone, a notebook computer, a portable music player, or the like.

Figure 1:
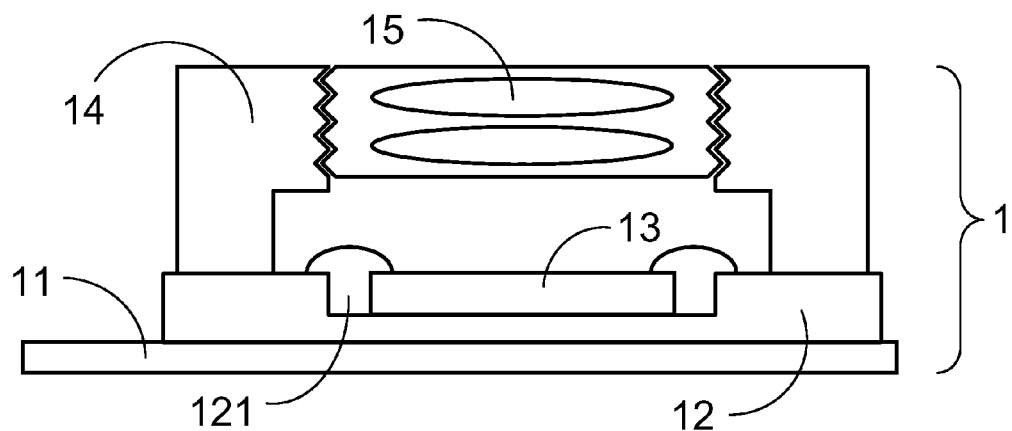
FIG. 1 is a schematic side view illustrating a conventional camera module.
Figure 2:
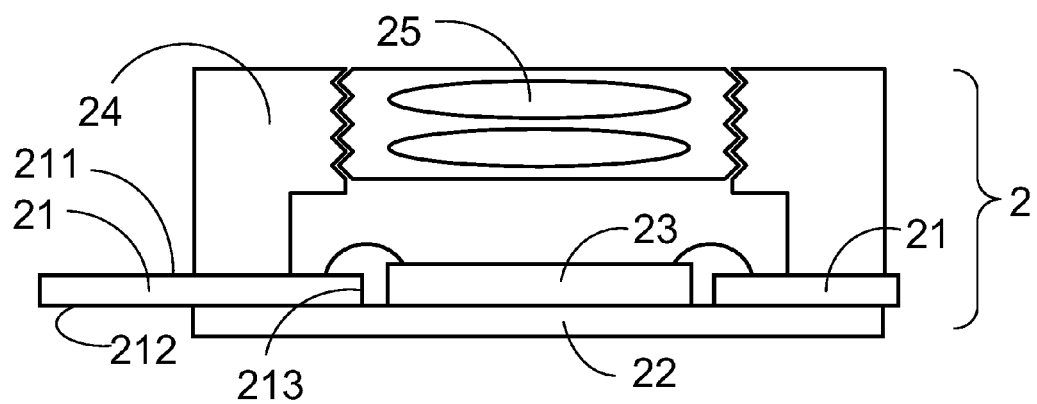
FIG. 2 is a schematic side view illustrating a camera module according to an embodiment of the present invention.

FIG. 2 is a schematic side view illustrating a camera module according to an embodiment of the present invention. As shown in FIG. 2, the camera module 2 comprises a circuit board 21, a base plate 22, an image chip 23, a holder 24 and a lens assembly 25. The circuit board 21 comprises a first surface 211, a second surface 212 and a hollow portion 213. The hollow portion 213 runs through the first surface 211 and the second surface 212. The base plate 22 is fixed on the second surface 212 of the circuit board 21 such that the hollow portion 213 of the circuit board 21 is sheltered by the base plate 22. The image chip 23 is disposed on the base plate 22 and accommodated within the hollow portion 213. The image chip 23 is electrically connected with contact points (not shown) on the first surface 211 of the circuit board 21 by a wire bonding process. In accordance with a key feature of the present invention, since the circuit board 21 has the hollow portion 213 and the image chip 23 is accommodated within the hollow portion 213, the image chip 23 could be arranged at the same level with the circuit board 21 and superposed with each other. Under this circumstance, the overall height of the camera module 2 is lowered.

Please refer to FIG. 2 again. The holder 24 is fixed on the first surface 211 of the circuit board 21. The lens assembly 25 is fixed within the holder 24 by screwing. Via the lens assembly 25, an external image could be focused on the image chip 23.

The circuit board 21 used in the camera module 2 of the present invention includes any circuit board that is widely used in the art. An example of the circuit board 21 includes but is not limited to a flexible printed circuit board, a rigid printed circuit board or a rigid-flexible printed circuit board. Through the circuit board 21, the sensing signals generated by the image chip 23 could be transmitted to the electronic device that the camera module 2 is applied thereto.

The base plate 22 used in the camera module 2 of the present invention is a single-layered or multi-layered structure. An example of the base plate 22 includes but is not limited to a glass plate, a ceramic plate or an acrylics plate. For reinforcing the structural strength of the camera module 2, another example of the base plate 22 includes a metallic plate such as an iron plate, an aluminum plate, a copper plate, a steel plate or a stainless steel plate.

Figure 3A:
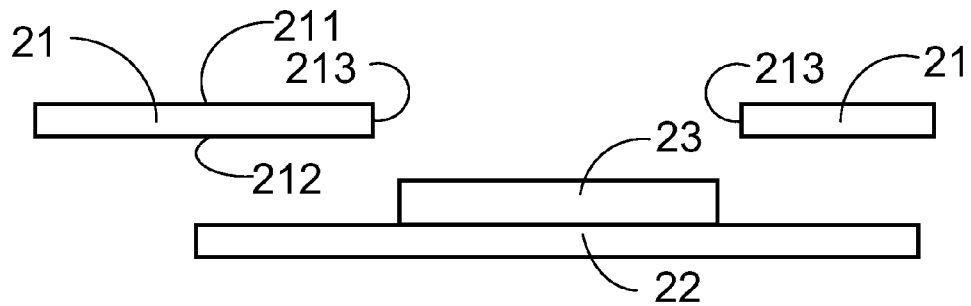
FIGS. 3A~3D are schematic views illustrating the steps of assembling the camera module according to the embodiment of the present invention.
Figure 3B:
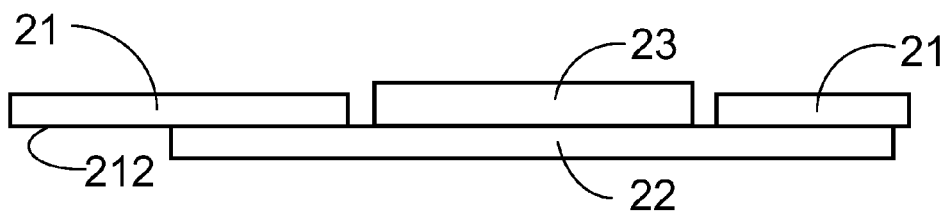
Figure 3C:
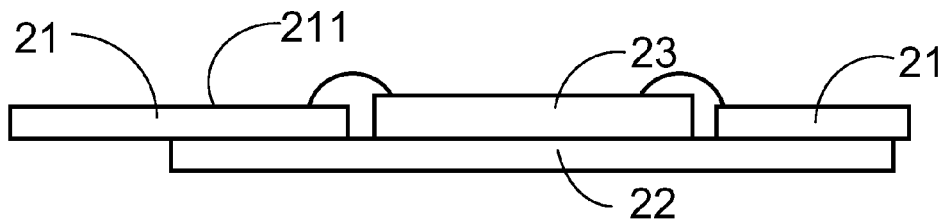
Figure 3D:
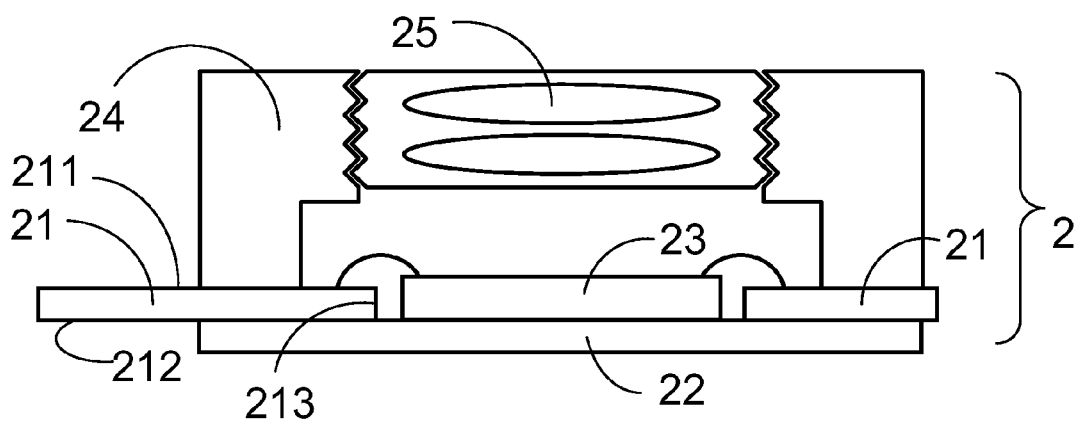

FIGS. 3A~3D are schematic views illustrating the steps of assembling the camera module according to the embodiment of the present invention. Firstly, as shown in FIG. 3A, an image chip 23 is fixed on a base plate 22 and a circuit board 21 is provided. The circuit board 21 comprises a first surface 211, a second surface 212 and a hollow portion 213 running through the first surface 211 and the second surface 212. Next, as shown in FIG. 3B, the base plate 22 is fixed on the second surface 212 of the circuit board 21 and the image chip 23 is accommodated or inserted within the hollow portion 213 of the circuit board 21. In some embodiments, base plate 22 is fixed on the second surface 212 of the circuit board 21 by a gluing or laminating process. Next, as shown in FIG. 3C, the image chip 23 is electrically connected with the circuit board 21. In some embodiments, the image chip 23 is electrically connected with contact points (not shown) on the first surface 211 of the circuit board 21 by a wire bonding process. Afterwards, as shown in FIG. 3D, a holder 24 supporting a lens assembly 25 is fixed on the first surface 211 of the circuit board 21. In some embodiments, the holder 24 is fixed on the circuit board 21 by a gluing or laminating process. Meanwhile, the camera module 2 is assembled.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A camera module comprising:
   a circuit board comprising a first surface, a second surface and a hollow portion running through said first surface and said second surface;
   a base plate fixed on said second surface of said circuit board such that said hollow portion of said circuit board is sheltered by said base plate;
   an image chip disposed on said base plate and accommodated within said hollow portion, and said image chip is arranged at the same level with said circuit board;
   a holder fixed on said first surface of said circuit board; and
   a lens assembly fixed on said holder.

2. The camera module according to claim 1 wherein said image chip is electrically connected with said circuit board by a wire bonding process.

3. The camera module according to claim 1 wherein said circuit board is a flexible printed circuit board.

4. The camera module according to claim 1 wherein said circuit board is a rigid printed circuit board.

5. The camera module according to claim 1 wherein said circuit board is a rigid-flexible printed circuit board.

6. The camera module according to claim 1 wherein said base plate is a metallic plate.

7. The camera module according to claim 6 wherein said metallic plate is an iron plate.

8. The camera module according to claim 6 wherein said metallic plate is an aluminum plate.

9. The camera module according to claim 6 wherein said metallic plate is a copper plate.

10. The camera module according to claim 6 wherein said metallic plate is a steel plate.

11. The camera module according to claim 6 wherein said metallic plate is a stainless steel plate.

12. A method for assembling a camera module, said method comprising:
    fixing an image chip on a base plate;
    providing a circuit board, wherein said circuit board comprises a first surface, a second surface and a hollow portion running through said first surface and said second surface;
    fixing a base plate on said second surface of said circuit board such that said image chip is accommodated within said hollow portion of said circuit board and said image chip is arranged at the same level with said circuit board;
    electrically connecting said image chip with said circuit board; and
    fixing a holder on said first surface of said circuit board such that a lens assembly is supported by said holder.

13. The method according to claim 12 wherein said image chip is electrically connected with said circuit board by a wire bonding process.

14. The method according to claim 12 wherein said circuit board is selected from the group consisting of flexible printed circuit board, rigid printed circuit board, and rigid-flexible printed circuit board.

15. The method according to claim 12 wherein said base plate is a metallic plate.

16. The method according to claim 15 wherein said metallic plate is selected from the group consisting of iron plate, aluminum plate, copper plate, steel plate, and stainless steel plate.

17. A camera module comprising:
    a flexible printed circuit board comprising a first surface, a second surface and a hollow portion running through said first surface and said second surface;
    a metallic plate fixed on said second surface of said circuit board such that said hollow portion of said circuit board is sheltered by said base plate;
    an image chip disposed on said base plate and accommodated within said hollow portion, and said image chip is arranged at the same level with said circuit board;
    a holder fixed on said first surface of said circuit board; and
    a lens assembly fixed on said holder.

* * * * *